United States Patent [19]

Tabara

[11] Patent Number: 5,514,621
[45] Date of Patent: May 7, 1996

[54] METHOD OF ETCHING POLYSILICON USING A THIN OXIDE MASK FORMED ON THE POLYSILICON WHILE DOPING

[75] Inventor: Suguru Tabara, Hamamatsu, Japan

[73] Assignee: Yamaha Corporation, Shizuoka, Japan

[21] Appl. No.: 88,797

[22] Filed: Jul. 8, 1993

[30] Foreign Application Priority Data

Jul. 10, 1992 [JP] Japan ................................ 4-207082

[51] Int. Cl.$^6$ ..................... H01L 21/316; H01L 21/44; H01L 21/443
[52] U.S. Cl. ................. 437/186; 437/191; 437/228; 437/239
[58] Field of Search .................................. 437/228, 233, 437/186, 191, 193, 238, 239

[56] References Cited

U.S. PATENT DOCUMENTS

| | | | |
|---|---|---|---|
| 3,825,997 | 7/1974 | Wakamiya | 29/578 |
| 4,074,300 | 2/1978 | Sakai et al. | 357/23 |
| 4,925,807 | 5/1990 | Yoshikawa | 437/44 |
| 4,970,173 | 11/1990 | Robb | 437/29 |
| 5,007,982 | 4/1991 | Tsou | 156/643 |

OTHER PUBLICATIONS

Iizuka & Nakamura, "High Selective Reactive Ion Etching of Gate Materials with HBr and Carbon Eliminated Clean Process," *SDM90-84* 51–55 (1990).

Matsuura et al., "Anisotropic Etching of n+Polysilicon with High Selectivity Using a Nitrogen Added Chlorine ECR Plasma," *SDM90-83* 45–50 (1990).

Nakamura, Moritaka, et al., "Mechanism of High Selectivity and Impurity Effects in HBr RIE: In–Situ Surface Analysis", Jpn. J. of Appl. Phys. vol. 31 pp. 1999–2005 Part, 1 No. 6B, Jun. 1992.

*Primary Examiner*—R. Bruce Breneman
*Assistant Examiner*—Matthew Whipple
*Attorney, Agent, or Firm*—Loeb & Loeb

[57] ABSTRACT

A polysilicon layer is deposited on a gate insulating film covering the surface of a semiconductor substrate, and thereafter the polysilicon layer is subjected to an impurity doping process in an oxidization atmosphere with heating, to reduce the resistance of the polysilicon layer, and to oxidize the surface of the polysilicon layer and form a silicon oxide film. The silicon oxide film is selectively etched to leave an etching mask. Thereafter, the polysilicon layer is selectively etched to leave an electrode layer or wiring layer by using etching gas not containing carbon and fluorine and using the etching mask. It is possible to obtain a high etching selection ratio with simple processes.

16 Claims, 6 Drawing Sheets

METHOD OF ETCHING POLYSILICON USING A THIN OXIDE MASK FORMED ON THE POLYSILICON WHILE DOPING

BACKGROUND OF THE INVENTION

1. Field of the Invention

The present invention relates to a method of manufacturing a semiconductor device, and more particularly to a method of manufacturing a semiconductor device having a fine electrode or wiring pattern made of polycrystalline silicon.

2. Description of the Related Art

Conventionally, a method such as illustrated in FIGS.8 to 10 has been proposed in forming a gate electrode of polycrystalline silicon (polysilicon) in a MOS type LSI or the like.

Referring to FIG.8, the surface of a semiconductor substrate 10 made of silicon is oxidized to form a gate insulating film 12 made of silicon oxide. Thereafter, a polysilicon layer 14 is deposited on the insulating film 12 by means of a chemical vapor deposition method (CVD) or the like. N-type impurities P are doped in the polysilicon layer 14 to lower the resistance of the polysilicon layer 14, by a diffusion process using gas such as $O_2+POCl_3$. During this diffusion process, a silicon oxide film including impurity oxide (such as $P_2O_5$) is formed on the surface of the polysilicon layer 14. This silicon oxide film is removed by an etching process.

Thereafter, a resist pattern 15 corresponding to a desired gate electrode pattern is formed on the surface of the polysilicon layer 14. Using the resist pattern is as a mask, the polysilicon layer 14 is selectively etched by means of a dry etching process using HBr or $Cl_2$ as etchant, to leave a gate electrode layer 14A.

Referring next to FIG.9, an ashing process using $O_2$ gas and a washing process using $H_2SO_4/H_2O_2$ are performed to remove the resist pattern 15. In this case, peripheral layers 15a and 15b of the resist pattern 15 are left unremoved, the components of those layers having been altered by etching gas or reaction by-products. The component-altered layers 15a and 15b are removed by an HF process as illustrated in FIG.10. In this manner, a polysilicon gate electrode of a MOS transistor is formed.

Another method of forming a gate electrode has been proposed as illustrated in FIGS.13 to 15. Like elements to those shown in FIGS.8 to 10 are represented by using identical reference numerals.

Referring to FIG.13, the processes up to the process of removing a silicon oxide film on the polysilicon layer 14 formed during the impurity doping process are the same as those described with FIG.8. Thereafter, a silicon oxide film 17 is formed on the polysilicon layer 14 by means of a CVD method or the like. Then, a resist pattern 19 corresponding to a desired gate electrode pattern is formed on the film 17.

Referring next to FIG.14, using the resist pattern 19 as a mask, the silicon oxide film 17 is selectively and anisotropically etched to leave an oxide etching mask 17A. Thereafter, the resist pattern 19 is removed.

Referring next to FIG.15, using the oxide etching mask 17a, the polysilicon layer 14 is selectively dry-etched to leave a gate electrode layer 14A.

With the method explained with FIGS.8 to 10, during the polysilicon etching process shown in FIG.8, carbon (C) emerges from the organic compound resist pattern 15. Therefore, even if HBr or $Cl_2$ not containing C is used as etchant, the etching selection ratio of polysilicon to $SiO_2$ lowers (for example, refer to the monthly magazine "Semiconductor World", January issue, 1990, pp.81 to 84). From this reason, the thickness of the gate insulating film 12 made of $SiO_2$ reduces.

Further, the component-altered layers 15a and 15b shown in FIG.9 are left unavoidably if gas not containing C or F such as HBr or $Cl_2$ is used for the polysilicon etching. An HF process described with FIG.10 is therefore required in order to remove such component-altered layers. This HF process may reduce thickness of the gate insulating film 12 made of silicon oxide during the HF process.

Furthermore, as shown in FIG.11, in the case where resist layers 15A and 15B are deposited abreast on a polysilicon layer 14 to be etched, with the space W between the resist layers being set smaller than the thickness T of the resist layers, the aspect ratio T/W becomes larger. In this case, the etching speed for the polysilicon layer at the narrow space area becomes different from that at a broad area (or near an isolated pattern line), presenting a so-called micro loading effect which an etching rate varies depending upon a ratio of area of mask aperture to the entire area or upon local pattern density off the mask aperture.

For example, as shown in FIG. 12, consider the case where lines 14a and 14b with a narrow space therebetween are formed by etching the polysilicon layer 14 using the resist layers 15A and 15B as a mask. If the etching speed at the narrow space area is greater than other broad areas because of the micro loading effect, the gate insulating film 12 and/or the substrate surface may sometimes be etched partially. If the etching is suppressed to avoid this over-etching, the polysilicon at the narrow space area may sometimes be left unetched and the lines 14a and 14b are short-circuited. In such a case, the manufacturing yield and reliability are lowered.

With the method explained with FIGS.13 to 15, on the other hand, the following disadvantages are present: (a) a CVD process or the like is required to deposit a silicon oxide film, complicating the manufacturing process, and (b) the manufacturing yield may be lowered by particles because a CVD process produces relatively many particles.

SUMMARY OF THE INVENTION

It is an object of the present invention to eliminate the above-described disadvantages and provide a novel method of manufacturing a semiconductor device capable of etching a gate electrode made of a polysilicon layer easily and with a high etching selection ratio.

According to one aspect of the present invention, there is provided a method of manufacturing a semiconductor device comprising the steps of (a) forming a polysilicon layer on the insulative surface of a substrate, (b) subjecting the polysilicon layer to an impurity doping process in an oxidization atmosphere with heating, to reduce the resistance of the polysilicon layer and to oxidize the surface of the polysilicon layer and form a silicon oxide film, (c) selectively etching the silicon oxide film to leave an etching mask, and (d) selectively etching the polysilicon layer to cave an electrode layer or wiring layer by using etching gas not containing carbon and fluorine and using the etching mask.

According to the present invention, instead of a resist layer, a silicon oxide layer is used as an etching mask for etching a polysilicon layer, and etching gas not containing C and F is used. It is therefore possible to prevent the etching selection ratio relative to $SiO_2$ from being lowered by the presence of C or F, and to obtain a high etching selection ratio relative to an $SiO_2$ film of an etching mask or gate insulating film.

Since an $SiO_2$ film can be used as an etching mask even if it is thin, the $SiO_2$ film formed on the surface of the polysilicon layer during the impurity doping process can be used without a need of an additional CVD process or the like.

As described above, according to the present invention, etching gas not containing C and F is used for etching a polysilicon layer, and a silicon oxide film formed during the impurity doping process is used as the etching mask. The following advantages can therefore be obtained.

(1) A high etching speed or rate ratio (etching selectivity) of a polysilicon layer to an $SiO_2$ film can be obtained so that the thin $SiO_2$ film formed during the impurity doping process can be used as the etching mask. A CVD process or the like for forming an additional $SiO_2$ film is not necessary, simplifying the manufacturing process and eliminating a lower yield to be caused by particles. Furthermore, in the case of selective etching at a narrow space area as described with FIGS.11 and 12, the aspect ratio becomes small because the $SiO_2$ film as the etching mask is thin, thereby suppressing the micro loading effect and improving the manufacturing yield and reliability.

(2) Since an etching selection ratio of the polysilicon layer to the other underlie $SiO_2$ film such as a gate insulating film is also high, the reduction of the thickness of the underlie film can be suppressed, improving the manufacturing yield.

(3) Since a resist film is not used as the etching mask, the hydrofluoric acid process to remove component-altered layers as described with FIGS.9 to 10 is not necessary, and so the thickness of the gate insulating film will not be reduced, improving the manufacturing yield.

DETAILED DESCRIPTION OF THE PREFERRED EMBODIMENTS

Figure 1:
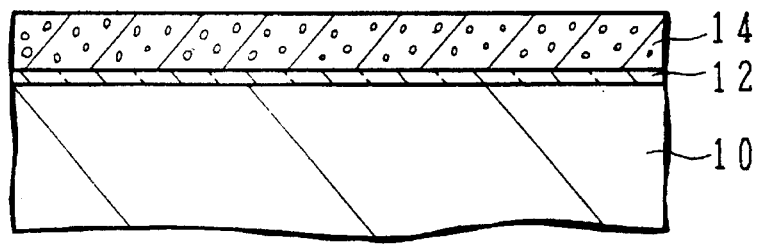
FIGS.1 to 6 are cross sections of a semiconductor substrate explaining a method of forming a gate electrode according to an embodiment of the present invention.
Figure 2:
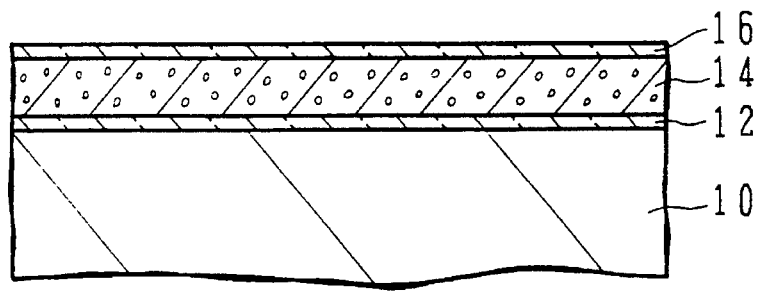
Figure 3:
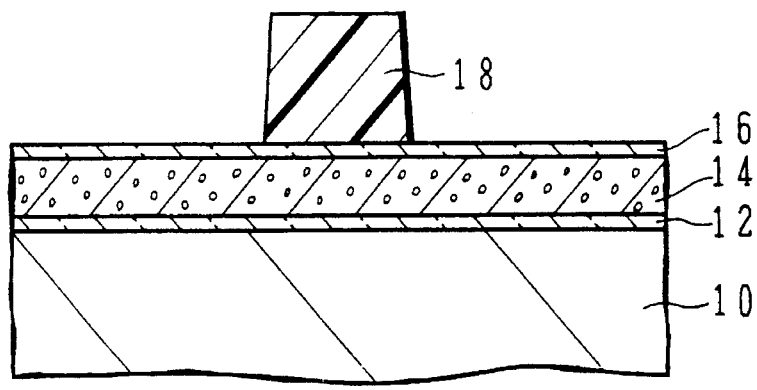
Figure 4:
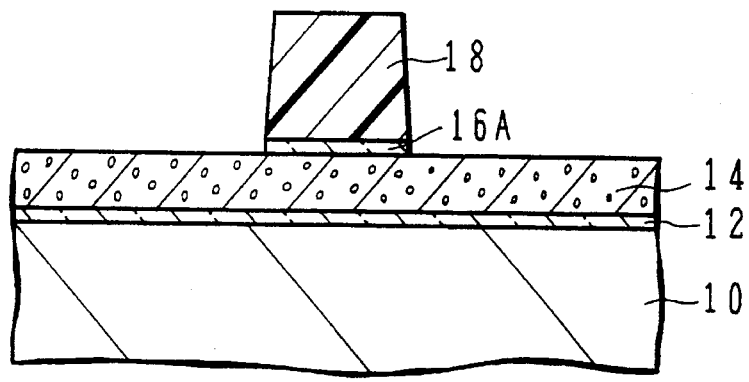
Figure 5:
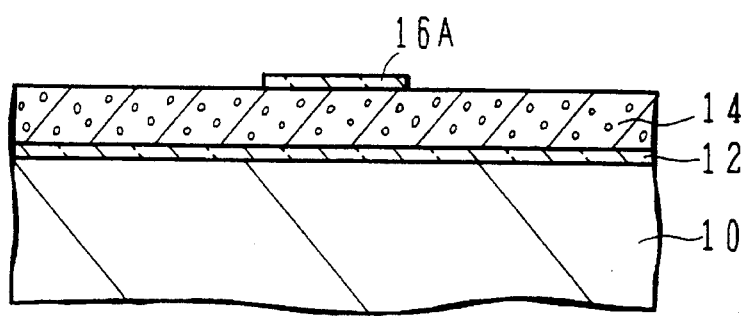

FIGS.1 to 6 illustrate a method of forming a gate electrode according to an embodiment of the present invention. The processes (1) to (6) corresponding to FIGS.1 to 6 will be described in this order.

(1) On the surface of a silicon semiconductor substrate 10, there is formed a gate insulating film 12 made of silicon oxide by means of a thermal oxidization method. A polycrystalline silicon (polysilicon) layer 14 is formed on the insulating film 12 by means of a CVD method or the like.

(2) A process of doping by diffusing impurities such as B, P and As into the polysilicon layer 14 is performed in an oxidization atmosphere, to reduce the resistance of the polysilicon layer 14 by doping the impurities therein, and to oxidize the surface of the polysilicon layer 14 and form a silicon oxide film 16. The silicon oxide film 16 is an oxide containing the impurities such as B, P, and As.

(3) A resist pattern 18 corresponding to a desired gate electrode pattern or wiring pattern is formed on the silicon oxide film 16.

(4) The silicon oxide film 16 formed in the diffusion process is selectively etched to leave an etching mask 16A, by using for example a reactive ion etching (RIE) apparatus and using the resist pattern 18 as the etching mask. The silicon oxide film 16 generates less particles therefrom than CVD-deposited films. The silicon oxide film 16 is used as the etching mask at the polysilicon etching process to be described later.

Figure 9:
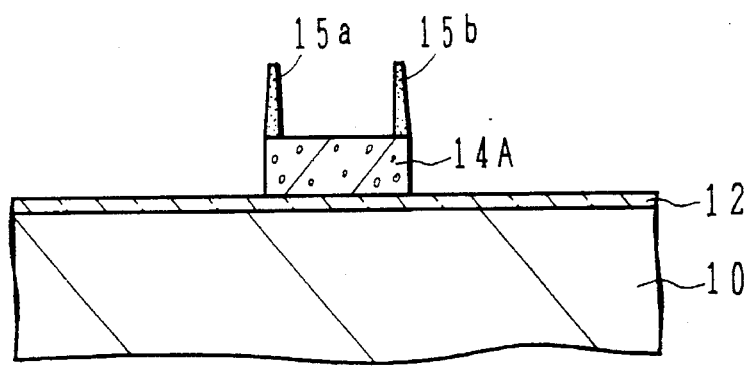
Figure 10:
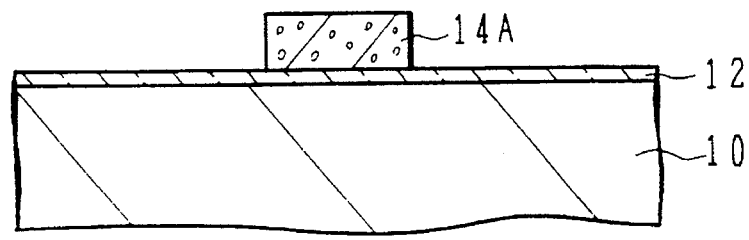
Figure 11:
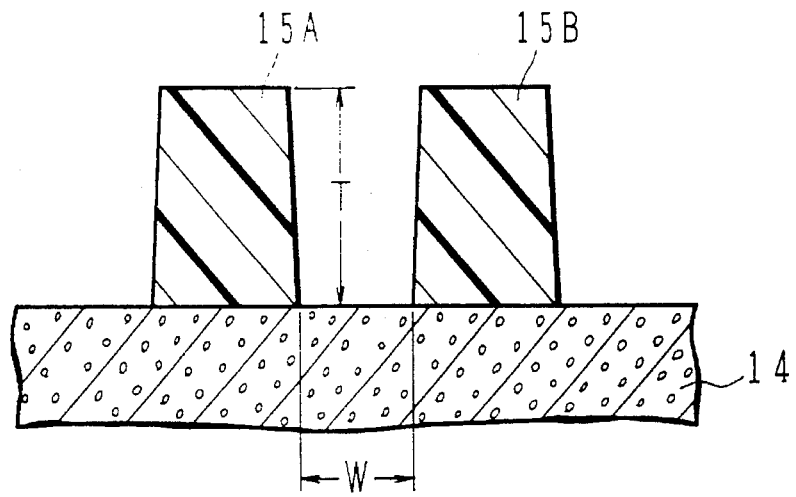
FIG.11 is a cross section of a semiconductor substrate explaining an aspect ratio of a resist thickness to a space between resist layers.
Figure 12:
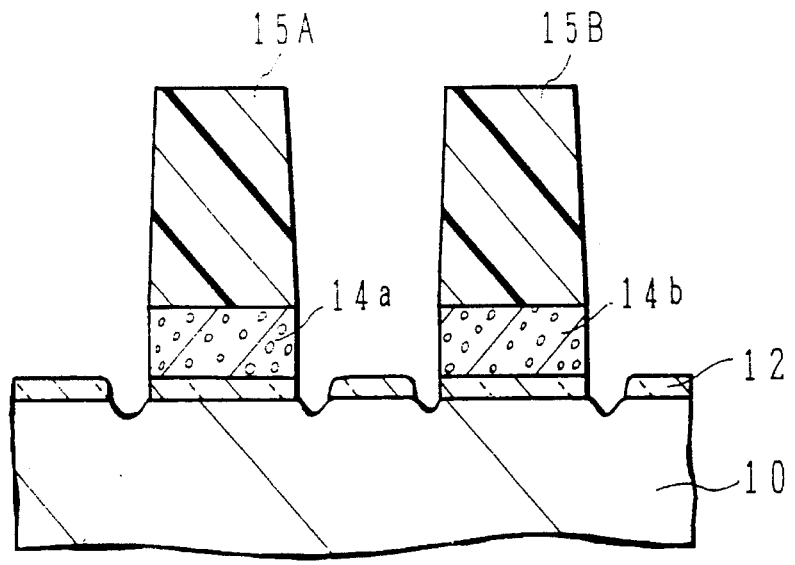
FIG.12 is a cross section of a semiconductor substrate showing the etched result in the case of a large aspect ratio of a resist thickness to a space between resist layers.
Figure 13:
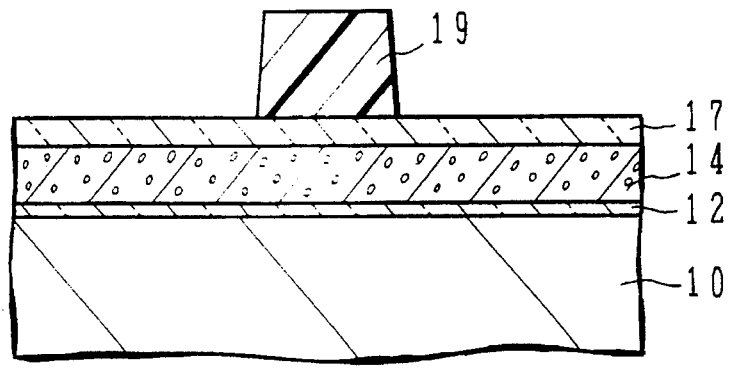
FIGS.13 to 15 are cross sections of a semiconductor substrate explaining another conventional method of forming a gate electrode.
Figure 14:
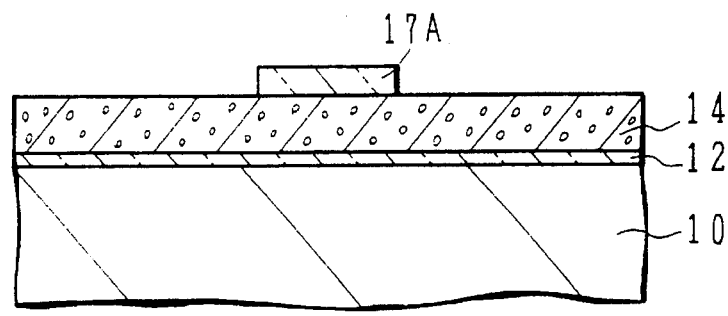
Figure 15:
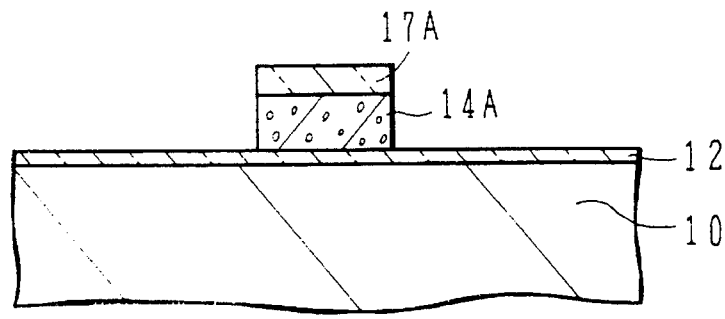

(5) The resist layer 18 is removed by an ashing process and a washing process using $H_2SO_4/H_2O_2$. The resist layer 18 can be removed completely because component-altered layers such as shown in FIG.9 are not formed.

(6) The polysilicon layer 14 is selectively and anisotropically etched to leave a gate electrode or wiring layer 14A, by using Br-based gas such as HBr or Cl-based gas such as $Cl_2$ gas as the etching gas and by using the etching mask 16A. Mixed gas medium, such as $HBr+O_2$, $HBr+Cl_2$ or $Cl_2+O_2$ or $Cl_2+O_2+N_2$ can be used. In this etching process, a resist layer is not used and etching gas not containing carbon (C) and fluorine (F), i.e., carbon-free and fluorine-free is used. It is therefore possible to obtain a high etching speed or rate ratio of the $SiO_2$ film of the insulating film 12 and mask 16A to the polysilicon layer 14.

Figure 6:
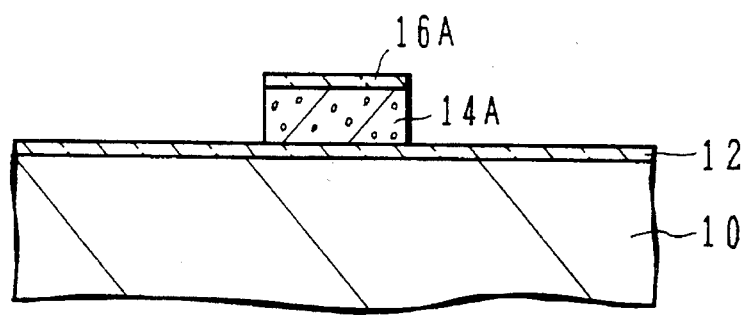
Figure 7:
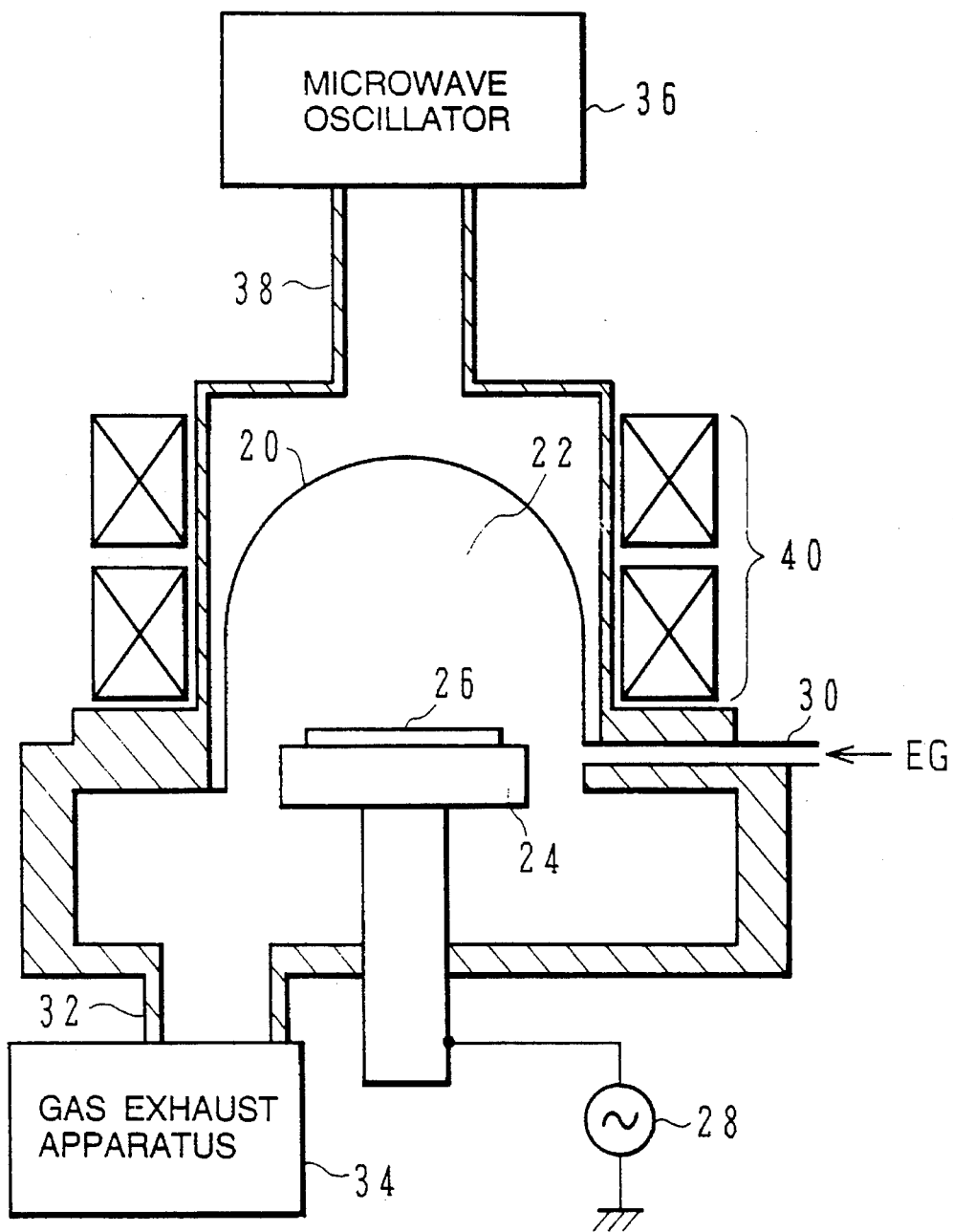
FIG.7 is a cross section showing a microwave plasma etcher to be used at the polysilicon etching process illustrated in FIG.6.

For the polysilicon etching process described with FIG.6, a microwave plasma etcher such as shown in FIG.7 may be used. Referring to FIG.7, in a reaction furnace 22 constructed of a quartz bell jar 20 and other elements, a specimen table 24 is mounted for supporting a wafer 26 such as a substrate to be processed. A high frequency power source 28 is electrically connected to the specimen table 24. Etching gas EG is introduced via a gas inlet pipe 30 into the reaction furnace 22, and the gas within the reaction furnace 22 is exhausted via a gas outlet pipe 32 from a gas exhausting apparatus 34. A microwave oscillator 36 supplies a microwave power to the reaction furnace 22 via a waveguide 38, and a magnetic field is applied to the inside of the reaction furnace from a solenoid coil 40.

The polysilicon etching conditions for such an etcher were set to the following values:

$Cl_2$ flow rate=50 sccm

Process pressure=5 mTorr

High frequency power=30 W

Specimen table temperature=20° C.

The etching performance under these conditions were:

Etching speed $V_P$ of polysilicon layer 14=225 nm/min

Etching speed $V_S$ of $SiO_2$ layer 12=15 nm/min

Etching speed ratio $R=V_P/V_S=15$

Figure 8:
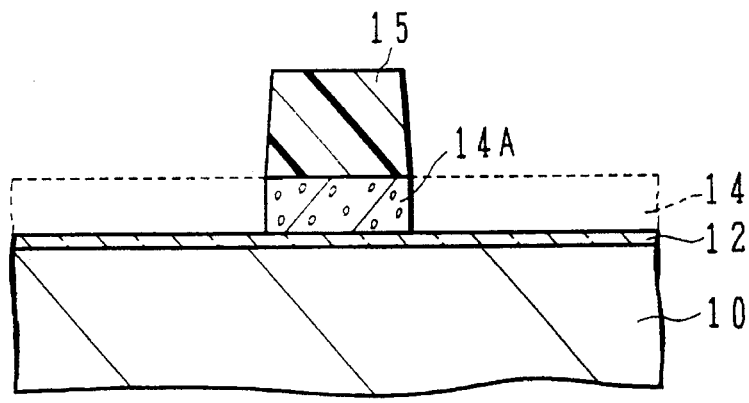
FIGS.8 to 10 are cross sections of a semiconductor substrate explaining a conventional method of forming a gate electrode.

For the purpose of comparison, the etching performance at the process described with FIG.8 was measured. Namely, under the above-described conditions, the silicon oxide film formed on the surface of the polysilicon layer 14 during the impurity doping process was etched by using an RIE apparatus, and thereafter a resist layer 15 was formed on the surface of the polysilicon layer 14 to etch the polysilicon layer 14 by using the resist layer 15 as a mask. The following etching performance was obtained:

Etching speed $V'_P$ of polysilicon layer 14=225 nm/min

Etching speed $V'_S$ of $SiO_2$ layer 12=26 nm/min

Etching speed ratio $R'=V'_P/V'_S=8.7$

It is apparent From the comparison between the etching speed ratios R and R' that the method of the invention using the $SiO_2$ mask 16A has an improved etching speed ratio relative to the gate insulating film 12 better than the conventional method using the resist layer 15 as a mask. Accordingly, even if an $SiO_2$ is thin, it can be used as the mask 16A. For example, for the selective etching of a polysilicon layer having a thickness of 350 nm, an $SiO_2$ film having a thickness of 23.3 nm or thicker can be used as the mask 16A.

The present invention is not limited to the above embodiment only, but various modifications, alterations, and combinations are possible. For example, in the process described with FIG.2, after impurity ions are injected into the polysilicon layer 14, a thermal treatment for the injected impurity activation may be performed in an oxidization atmosphere to reduce the resistance of the polysilicon layer 14 and form the silicon oxide film 16.

I claim:

1. A method of manufacturing a semiconductor device comprising the steps of:
   (a) forming a polysilicon layer on an insulative surface of a substrate;
   (b) doping an impurity into said polysilicon layer in an oxidization atmosphere with heating, to reduce a resistance of said polysilicon layer and to oxidize a surface of said polysilicon layer and form a particle-less silicon oxide film thereon; and
   (c) selectively etching said silicon oxide film to form an etching mask consisting solely of a remaining silicon oxide film formed in said step (b), and selectively etching said polysilicon layer through said etching mask to leave an electrode layer or wiring layer by using a carbon-free and fluorine-free etching gas.

2. A method according to claim 1, wherein said substrate is a silicon substrate having a silicon oxide layer on the surface of said substrate.

3. A method according to claim 1, wherein said step of forming said etching mask includes forming a resist pattern on said silicon oxide film, selectively etching said silicon oxide film by using said resist pattern as an etching mask, and removing said remaining resist pattern.

4. A method of manufacturing a semiconductor device comprising the steps of:
   (a) providing a substrate;
   (b) forming a polysilicon layer on the substrate;
   (c) doping an impurity into the polysilicon layer;
   (d) concurrently with the step (c), forming a particle-less silicon oxide film on the polysilicon layer;
   (e) forming a patterned mask consisting solely of the remaining silicon oxide film formed in step (d); and
   (f) etching the polysilicon layer through the patterned mask of the silicon oxide film.

5. A method according to claim 4, wherein in the step (a), the substrate comprises a semiconductor material.

6. A method according to claim 5, wherein the substrate has an insulating layer formed thereon.

7. A method according to claim 4, wherein the polysilicon layer is formed using chemical vapor deposition (CVD).

8. A method according to claim 4, wherein the step (c), the impurity comprises a material selected from a group consisting of boron, phosphorus and arsenic.

9. A method according to claim 4, wherein the step (e) further comprises the steps of:

forming a resist layer; and (e-2) patterning the resist layer to form a resist mask.

10. A method according to claim 9, wherein the step (e) further comprises the steps of:
    (e-3) selectively etching the silicon oxide film using the resist mask; and
    (e-4) removing the resist mask.

11. A method according to claim 10, wherein the patterned resist mask is removed in step (e-4) through an ashing process using $H_2SO_4$ or $H_2O_2$.

12. A method according to claim 4, wherein in the step (f), the polysilicon layer is etched using a material selected from the group HBr, $Cl_2$, HBr+$O_2$, HBr+$Cl_2$, and $Cl_2$+$O_2$+$N_2$.

13. A method of manufacturing a semiconductor device comprising the steps of:
    (a) forming a polysilicon layer on a surface of a substrate;
    (b) doping an impurity into said polysilicon layer in an oxidization atmosphere with heating so that a surface of said polysilicon layer is oxidized to form a silicon oxide film; and
    (c) selectively etching said silicon oxide film to form a silicon oxide etching mask consisting solely of the remaining silicon oxide film formed in step (b) and selectively etching said polysilicon layer through said silicon oxide etching mask using a carbon-free and fluorine-free etching gas to leave an electrode layer or wiring layer.

14. A method according to claim 13, wherein in the step (c), the polysilicon layer is etched using a material selected from the group HBr, $Cl_2$, HBr+$O_2$, HBr+$Cl_2$, and $Cl_2$+$O_2$+N.

15. A method according to claim 13, wherein the substrate comprises a semiconductor material.

16. A method according to claim 13, wherein the substrate has an insulating layer formed thereon.

* * * * *